(12) United States Patent
Lee et al.

(10) Patent No.: US 11,244,975 B2
(45) Date of Patent: Feb. 8, 2022

(54) IMAGE SENSING DEVICE HAVING ORGANIC PIXEL ARRAY AND INORGANIC PIXEL ARRAY

(71) Applicant: SK hynix Inc., Icheon-si (KR)

(72) Inventors: Kyoung-In Lee, Icheon-si (KR);
Hoon-Sang Oh, Icheon-si (KR);
Sung-Joo Hong, Seoul (KR)

(73) Assignee: SK hynix Inc., Icheon-si (KR)

( * ) Notice: Subject to any disclaimer, the term of this patent is extended or adjusted under 35 U.S.C. 154(b) by 156 days.

(21) Appl. No.: 16/660,120

(22) Filed: Oct. 22, 2019

(65) Prior Publication Data

US 2020/0194479 A1 Jun. 18, 2020

(30) Foreign Application Priority Data

Dec. 13, 2018 (KR) .................. 10-2018-0160904

(51) Int. Cl.
*H01L 27/146* (2006.01)

(52) U.S. Cl.
CPC .. *H01L 27/14609* (2013.01); *H01L 27/14603* (2013.01); *H01L 27/14621* (2013.01);
(Continued)

(58) Field of Classification Search
CPC ......... H01L 27/14609; H01L 27/14689; H01L 27/14621; H01L 27/14627;
(Continued)

(56) References Cited

U.S. PATENT DOCUMENTS

2006/0054782 A1* 3/2006 Olsen .................. H04N 5/228
250/208.1
2008/0278608 A1 11/2008 Kim et al.
(Continued)

FOREIGN PATENT DOCUMENTS

| CN | 107003785 A | 8/2017 |
|---|---|---|
| CN | 107431746 A | 12/2017 |
| JP | S59122193 A | 7/1984 |

OTHER PUBLICATIONS

Office Action dated Jul. 2, 2021 for Chinese Patent Application No. 201911015445.6 (17 pages).

*Primary Examiner* — Jennifer D Bennett
(74) *Attorney, Agent, or Firm* — Perkins Coie LLP

(57) ABSTRACT

An image sensing device is provided to include organic and inorganic photosensing regions. The organic photosensing region includes an organic material and provides a first image signal generated in response to light incident on the organic photosensing region. The inorganic photosensing region includes an inorganic material and provides a second image signal generated in response to light incident on the inorganic photosensing region. The image sensing device further includes: top and bottom electrodes formed on opposite sides of the organic photosensing region, a first storage region disposed relative to the organic photosensing region and storing the first image signal, a second storage region disposed relative to the inorganic photosensing region and storing the second image signal, and a logic circuit disposed to receive the first image signal and the second image signal and processing at least one of the first image signal or the second image signal.

24 Claims, 10 Drawing Sheets

(52) U.S. Cl.
CPC .. *H01L 27/14627* (2013.01); *H01L 27/14634* (2013.01); *H01L 27/14636* (2013.01); *H01L 27/14689* (2013.01)

(58) Field of Classification Search
CPC ......... H01L 27/14603; H01L 27/14636; H01L 27/14645; H01L 27/14634; H04N 9/045; H04N 5/335; H04N 5/369
See application file for complete search history.

(56) References Cited

U.S. PATENT DOCUMENTS

| | | | |
|---|---|---|---|
| 2009/0115884 A1* | 5/2009 | Matsusaka | G02B 15/143507 348/347 |
| 2013/0215290 A1* | 8/2013 | Solhusvik | H04N 5/2355 348/231.99 |
| 2017/0048500 A1* | 2/2017 | Shi | H04N 5/379 |
| 2017/0085764 A1* | 3/2017 | Kim | H04N 5/23296 |
| 2017/0309667 A1* | 10/2017 | Yamashita | H01L 27/1469 |
| 2017/0359536 A1 | 12/2017 | Lee et al. | |
| 2017/0363741 A1* | 12/2017 | Send | G01S 7/4816 |
| 2018/0270404 A1* | 9/2018 | Ishida | G02B 7/025 |

* cited by examiner

IMAGE SENSING DEVICE HAVING ORGANIC PIXEL ARRAY AND INORGANIC PIXEL ARRAY

CROSS-REFERENCE TO RELATED APPLICATION

This patent document claims priority to Korean Patent Application No. 10-2018-0160904 filed on Dec. 13, 2018, which is incorporated herein by reference in its entirety.

TECHNICAL FIELD

Various embodiments of the disclosed technology relate to an image sensing device and a camera system.

BACKGROUND

With the recent development of the information communication industry and the digitalization of electronic devices, image sensors with improved performance have been used in various fields such as a digital camera, a camcorder, a mobile phone, a PCS (personal communication system), a game machine, a security camera and a medical micro camera.

SUMMARY

This patent document provides implementations and examples of image sensing devices and a camera system including an image sensing device, wherein the image sensing device includes an organic pixel array including an organic photosensing material and an inorganic pixel array including inorganic photosensing material. With the hybrid structure of the organic pixel array and the inorganic pixel array, it is possible to provide an image sensing device with benefits, e.g., high photosensitivity and color detection capability, obtained from both the organic pixel array and the inorganic pixel array. In addition, the suggested implementations make it possible to achieve a high resolution and miniaturization of an image sensing device and a camera system including the image sensing device.

In one aspect, an image sensing device is provided to comprise: an organic photosensing region including an organic material and configured to provide a first image signal generated in response to light incident on the organic photosensing region; top and bottom electrodes formed on opposite sides of the organic photosensing region and configured to facilitate generation of the first image signal; a first storage region disposed relative to the organic photosensing region and configured to store the first image signal; an inorganic photosensing region including an inorganic material and configured to provide a second image signal generated in response to light incident on the inorganic photosensing region; a second storage region disposed relative to the inorganic photosensing region and configured to store the second image signal; and a logic circuit disposed to receive the first image signal and the second image signal and configured to process at least one of the first image signal or the second image signal.

In some implementations, the organic photosensing region and the inorganic photosensing region are disposed over a first substrate. In some implementations, the logic circuit is disposed over a second substrate different from the first substrate. In some implementations, the organic photosensing region includes organic image sensing pixels and the inorganic photosensing region includes inorganic image sensing pixels, each organic image sensing pixel having the same size as that of each inorganic image sensing pixel. In some implementations, the organic photosensing region includes organic image sensing pixels and the inorganic photosensing region includes inorganic image sensing pixels, each inorganic image sensing pixel having sub-pixels, each organic image sensing pixel having a size four times greater than that of a sub-pixel of each inorganic image sensing pixel. In some implementations, the top electrode includes a transparent conducting material. In some implementations, the bottom electrode includes a metal.

In some implementations, the organic photosensing region further includes a color filter disposed over the organic material and configured to allow the first image signal to include color information corresponding to certain colored light. In some implementations, the organic material allows the first image signal to include color information corresponding to certain colored light. In some implementations, the inorganic photosensing region further includes a color filter disposed over the inorganic material and configured to allow the first image signal to include color information from certain colored light. In some implementations, the organic photosensing region further includes a first microlens and the inorganic photosensing region further includes a second microlens, the first microlens having a diameter two times greater than that of the second microlens. In some implementations, the image sensing device is part of a camera image system that includes: the image sensing device; a lens formed over the image sensing device; and a housing that forms a space for accommodating the image sensing device. In some implementations, the camera image system further includes an infrared filter disposed between the image sensing device and the lens and configured to reflect the infrared rays of light.

In another aspect, an image sensing device is provided to comprise: a substrate; organic image sensing pixels disposed over a first region of the substrate and including organic photosensing materials; and inorganic image sensing pixels disposed over a second region of the substrate and including inorganic photosensing materials, the second region separated from the first region. In some implementations, each of the organic image sensing pixels includes: an organic photosensing layer including an organic material to generate first photocharges in response to light incident on the organic photosensing pixel; top and bottom electrodes formed on opposite sides of the organic photosensing layer and configured to facilitate generation of the first photocharges; and a first storage region disposed relative to the organic photosensing region and configured to store the first photocharges. In some implementations, each of the inorganic image sensing pixels includes: an inorganic photoconversion element configured to generate second photocharges in response to light incident on the inorganic photosensing pixel; and a second storage region disposed relative to the inorganic photoconversion element and configured to store the second photocharges.

In some implementations, each of the inorganic image sensing pixels further includes: a microlens; and a color filter disposed under the microlens and over the substrate, wherein the microlens and the color filter are in optical alignment with the inorganic photoconversion element. In some implementations, each of the inorganic image sensing pixel further includes a grid pattern formed at the same level as the bottom electrode and includes the same material as the bottom electrode. In some implementations, each of the inorganic image sensing pixels has the size same as that of each organic image sensing pixels. In some implementations, each of the inorganic image sensing pixels has sub-pixels, each sub-pixel having a corresponding color filter that is configured to allow light of a particular wavelength or range of wavelengths to reach the sub-pixel.

In some implementations, the image sensing device further comprises an interconnection region disposed between the first region and the second region of the substrate and including first connections to the organic image sensing pixels and second connections to the inorganic image sensing pixels. In some implementations, the image sensing device further comprises an additional substrate on which a logic circuit is formed, the logic circuit providing control signals to the organic image sensing pixels and the inorganic image sensing pixels. In some implementations, the additional substrate is spaced apart from the substrate by a dielectric layer. In some implementations, the image sensing device is part of a camera image system that includes: the image sensing device; a lens formed over the image sensing device; and a housing that forms a space for accommodating the image sensing device. In some implementations, the camera image system further includes an infrared filter disposed between the image sensing device and the lens and configured to reflect the infrared rays of light.

More details of various implementations are explained with reference to the detailed description and the drawings.

Since the image sensing device according to some implementations of the disclosed technology includes organic image sensing pixels and inorganic image sensing pixels, it is possible to obtain an image with both excellent light sensitivity and excellent color sensitivity.

Because the image sensing device in accordance with some implementations of the disclosed technology includes an organic pixel array and an inorganic pixel array which are integrated on the same substrate, it is possible to achieve a high resolution and miniaturization.

Other advantages according to various implementations of the disclosed technology will be described in the detailed description.

DETAILED DESCRIPTION

This patent document provides implementations and examples of an image sensing device and a camera system that are useful in various electronic applications. Some implementations of the image sensing device can have an integrated or hybridized structure with organic photosensing material and inorganic photosensing material.

Image sensors made with inorganic photosensing materials ("inorganic image sensors"), such as silicon, exhibit high quantum yield and have been used broadly in visible light detection applications. However, the inorganic image sensors characteristically present a flat photocurrent voltage response, which makes it difficult to be used for fabricating high pixel density. In addition, the fabrication of the inorganic image sensors tends to involve sophisticated and costly processes and thus their applications are somewhat limited. The inorganic image sensors are also vulnerable to noise.

Image sensors with organic photosensing materials ("organic image sensors") provide promising process advantages. The photosensitivity of the image sensors made with organic photosensing materials, such as polymers, is comparable to that of photodiodes made with inorganic materials. In addition to their high photosensitivity, these organic image sensors show large dynamic range which is relatively flat. Image sensors with high sensitivity organic photosensing materials can be fabricated in large areas by processing from solution at room temperature and provide quite flexibility in fabrication processes. For example, the organic image sensors can be made in unusual shapes (e.g. on a hemisphere to couple with an optical component or an optical system) or can be made in flexible or foldable forms.

This patent document provides implementations and examples of an image sensing device that can benefit from both the organic photosensing characteristics and inorganic photosensing characteristics. Depending on the needs, both or one of the organic photosensing characteristics and the inorganic photosensing characteristics can be selectively considered to process an image signal generated in response to light. Various aspects of the implementations and examples will be discussed in this patent document with following exemplary embodiments taken in conjunction with the drawings.

Figure 1:
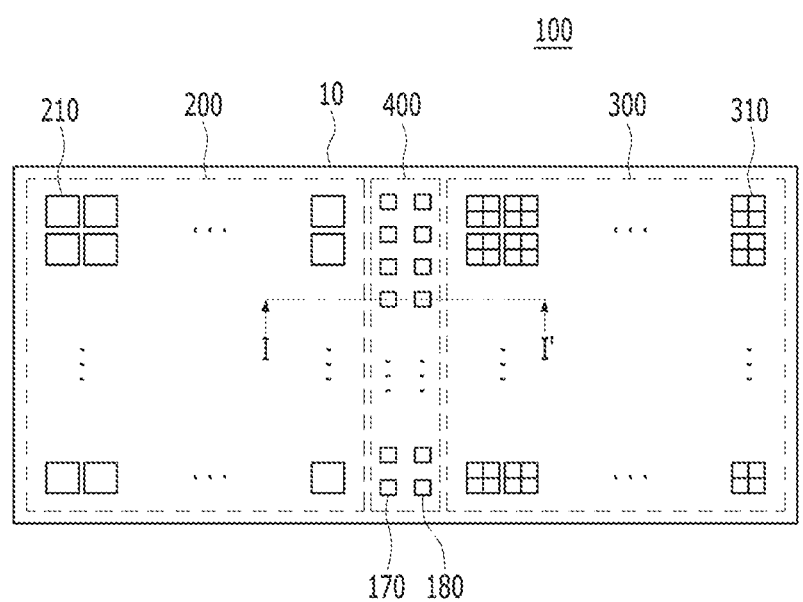
FIG. 1 is a top view illustrating a representation of an example of an image sensing device in accordance with an embodiment of the disclosed technology.

FIG. 1 is a top view illustrating a representation of an example of an image sensing device 100 in accordance with an embodiment of the disclosed technology. Referring to FIG. 1, the image sensing device 100 in accordance with the embodiment of the disclosed technology may include an organic pixel array 200 including organic image sensing pixels 210 including organic photosensing materials and an inorganic pixel array 300 including inorganic image sensing pixels 310 including inorganic photosensing materials. The organic pixel array 200, the inorganic pixel array 300 and the interconnection region 400 may be realized and integrated on or over a same substrate 10. The organic pixel array 200 and the inorganic pixel array 300 may include organic image sensing pixels 210 and inorganic image sensing pixels 310, respectively, which are arranged in the form of matrixes including rows and columns. In another embodiment of the disclosed technology, the image sensing device 100 may be mounted or stacked on a circuit board such as a PCB (printed circuit board) or a module board.

The image sensing device 100 may further include an interconnection region 400 between the organic pixel array 200 and the inorganic pixel array 300. The interconnection region 400 provides electrical connections for the organic pixel region 200 and the inorganic pixel region 300. In some implementations, the interconnection region 400 includes a TSV array including a plurality of first TSV structures 170 which are arranged in a column direction line and a plurality of second TSV structures 180 which are arranged in the column direction line. The TSV array including the first TSV structures 170 and the second TSV structures 180 is described as an example and other implementations are possible without limiting to the TSV structures. In the example, the first TSV structures 170 may be arranged closer to the organic pixel array 200 than the inorganic pixel array 300 and the second TSV structures 180 may be arranged closer to the inorganic pixel array 300 than the organic pixel array 200. The first TSV structures 170 may be electrically coupled with the organic image sensing pixels 210 in the organic pixel array 200, and the second TSV structures 180 may be electrically coupled with the inorganic image sensing pixels 310 in the inorganic pixel array 300. While the organic image sensing pixels 210 and the inorganic image sensing pixels 310 are illustrated in the drawing as being spaced apart from each other, other implementations are also possible. For example, the organic image sensing pixels 210 and the inorganic image sensing pixels 310 may be arranged to be adjacent to each other.

Figure 2:
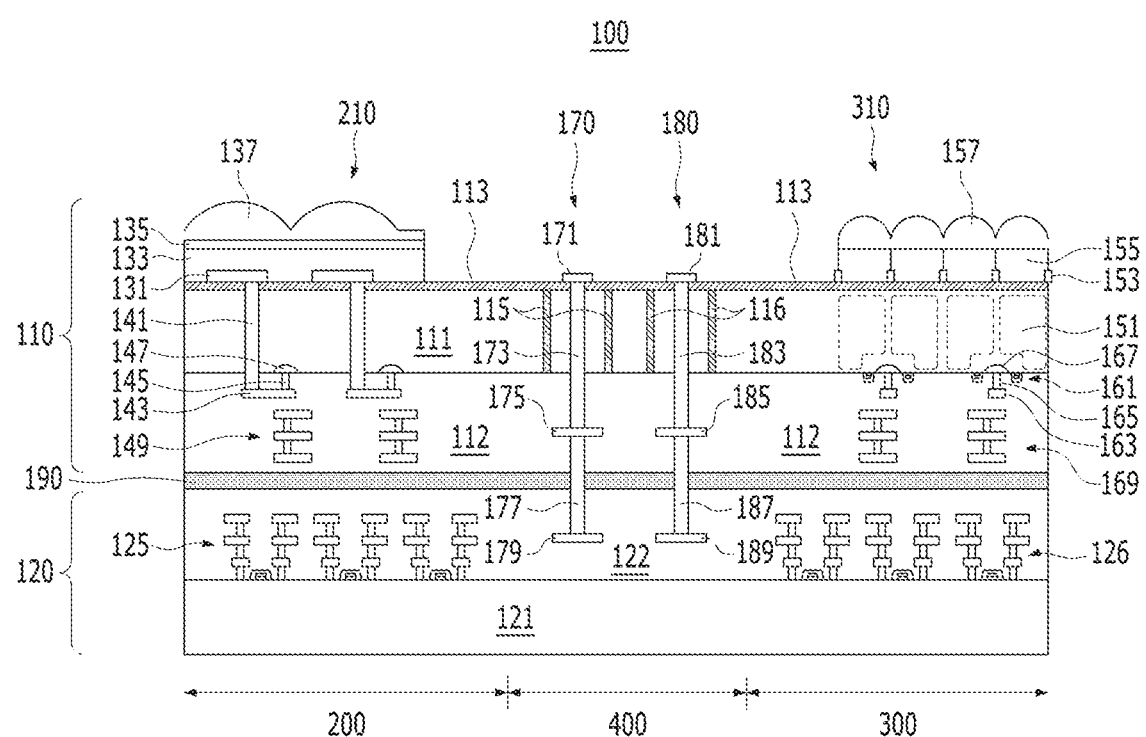
FIG. 2 is a cross-sectional view taken along a line I-I' in the image sensing device of FIG. 1.

FIG. 2 is a cross-sectional view taken along the line I-I' in the image sensing device 100 of FIG. 1. As shown in FIG. 2, the image sensing device 100 may include an image sensing area 110, an intermediate layer 190, and a logic circuit area 120 that are disposed along a vertical direction of the cross-sectional view of FIG. 2. In addition, the image sensing device 100 may include the organic pixel array 200 including the organic image sensing pixel 210, the interconnection region 400, and the inorganic pixel array 300 including the inorganic image sensing pixel 310 that are disposed along a longitudinal direction of the cross-sectional view of FIG. 2.

Image Sensing Area

The image sensing area 110 may include both the organic image sensing pixels 210 and the inorganic image sensing pixels 310. The image sensing area 110 generates photocharges in response to receiving light incident to the image sensing device.

Along a direction where the image sensing area 110 and the logic circuit area 120 are stacked, the image sensing area 110 may include a first dielectric layer 112, a substrate 111, and a second dielectric layer 113 that are sequentially stacked over one another. In the example of FIG. 2, the first dielectric layer 112 and the second dielectric layer 113 are disposed on opposite surfaces of the first substrate 111.

The substrate 111 of the image sensing area 110 may include monocrystalline silicon doped with an N-type ion and a P-type ion. The first dielectric layer 112 of the image sensing area 110 and the dielectric layer 122 of the logic circuit area 120 may include single-layered or multi-layered dielectric materials. For example, the first dielectric layer 112 and the dielectric layer 122 may include a silicon oxide ($SiO_2$) and/or a silicon nitride (SiN). The second dielectric layer 113 of the image sensing area 110 may include at least one among a silicon oxide ($SiO_2$), a silicon nitride (SiN), an aluminum oxide ($Al_2O_3$), a hafnium oxide ($HfO_2$) or other dielectric materials. The intermediate layer 190 may include dielectric material such as a silicon oxide ($SiO_2$).

Organic Pixel Array with Organic Image Sensing Pixel

The organic image sensing pixel 210 may be provided at one side of the interconnection region 400 and separated from the inorganic image sensing pixel 310 by the interconnection region 400. The organic image sensing pixel 210 may be configured to include an organic photosensing layer 133. In some implementations, the organic photosensing layer 133 may include organic material(s), such as a conjugated polymer, a polymer blend, a polymer/molecule polyblend, a layer of organic molecule or molecular blends. In some implementations, the organic photosensing layer 133 may include a multilayer structure combining the organic materials above materials, such as a conjugated polymer, a polymer blend, a polymer/molecule polyblend, a layer of organic molecule or molecular blends.

The organic photosensing layer 133 may include an organic material which can sense light and generate photocharges in response to the incident light. In some implementations, the organic image sensing pixel 210 may further include a microlens 137. When light is incident to the image sensing device 100, the microlens 137 which are formed over the organic photosensing layer 133 and have a hemispherical shape aid in focus the light onto the photosensing layer 133, thereby generating photocharges in response to the incident light. In some implementations, the microlens 137 may be omitted in the organic image sensing pixel 210. The organic photosensing layer 133 may be formed as a single layer on the surface dielectric layer 113. The organic photosensing layer 133 may cover the bottom electrodes 131. For achieving a color detection, the organic photosensing layer 133 can include certain materials having properties that capture specific wavelength range of light. In this case, the organic photosensing layer 133 can actually operate as the color filter by including materials selected or engineered to enable mono-color (e.g. white color) or multi-color (e.g., red, blue, and green) detection even without a separate color filter.

Alternatively, in some implementations, the organic pixel array can include a white filter or a color filter (other than white) between the organic photosensing layer 133 and the microlens 137. In some implementations, a white filter is transparent to white light and thus the organic photosensing layer 133 with the white filter can convert most of collected visible light into an image signal. In some implementations, red, blue, and green color filters can be included over a plurality of photosensing regions in the organic photosensing layer 133 and under the microlens 137. In this case, the red, blue and green color filters may be in optical alignment with the plurality of photosensing regions of the organic photosensing layer 133. Depending on the needs, the organic pixel array 200 can be designed to have the capability of converting at least one of whit light and non-white colored light (e.g., red, green, blue) into an image signal. As will be further discussed with reference FIGS. 3A and 4A, the light image sensing device can provide the high photosensitivity with the capability of converting white light and provide the full-color or selected-color detection with the capability of converting colored light.

The conductive electrodes 131 and 135 are disposed on two opposite surfaces, e.g., a bottom surface and a top surface, of the organic photosensing layer 133. The bottom electrodes 131 may be formed on the surface dielectric layer 113 on the substrate 111. The bottom electrodes 131 may include a metal such as tungsten (W). The top electrode 135 may include a transparent conductor such as an indium oxide to allow the incident light to be absorbed in the organic photosensing layer 133. The top electrode 135 may be formed as a single layer disposed over the organic photosensing layer 133. The bottom electrode 131 and the top electrode 135 may serve to extract electrons and holes from the photosensing layer 133 when incident light is absorbed in the photosensing layer 133. The photocharges generated in response to the incident light can be transferred to the storage region 147 through the connectors 141, 143, 145. In some implementations, the connector 141 and 145 may be provided in a plug or via and have a shape elongated along a vertical direction perpendicular to a surface of the substrate 111.

The connectors 141, 143, 145 are provided to transfer the photocharges form the bottom electrode 131 to the storage region 147. Each of the connectors 141, 143, 145 may include a metal such as tungsten (W), titanium (Ti), aluminum (Al) or copper (Cu), a metal compound such as a tungsten nitride (WN), a titanium nitride (TiN) or a tantalum nitride (TaN), or a conductor such as a metal alloy. The connectors 141, 143, and 145 may be disposed at the respective locations and provide operative or electrical coupling between corresponding elements. The connector 141 may be located to pass through the second dielectric layer 113 and the substrate 111. The connector 141 may further extend into the first dielectric layer 112. The connector 141 may have a vertically extending shape. The connector 141 may contact the bottom electrode 131 and the connector 143 at two opposite ends of the connector 141 and the connector 141 may electrically couple the bottom electrode 131 to the connector 143. The connector 141 may vertically overlap and be aligned with the bottom electrode 131 and the connector 143.

The connector 143 may be disposed in the first dielectric layer 112. The connector 143 may contact the connector 141 and connector 145 at two opposite ends of the connector 143 and electrically couple the connector 141 to the connector 145. The connector 143 may have a horizontally extending bar shape.

The connector 145 may be disposed in the first dielectric layer 112 and pass through a portion of the first dielectric layer 112. The connector 145 may contact the connector 143 and the storage region 147 at the two opposite ends of the connector 145 and may electrically couple the connectors 143 to the storage region 147. The connector 145 may have a pillar shape.

The storage regions 147 may be formed to store the photocharges generated in the organic photosensing layer 133 and transferred from the organic photosensing layer 133 through the bottom electrode and the connectors 141, 143, and 145. The first storage regions 147 may be disposed in the substrate 111 to be adjacent to the lower surface of the substrate 111. For example, the storage regions 147 may include floating diffusion regions which are N type doped. The storage regions 147 may be formed as N-type ions are doped in the substrate 111. In other words, the storage regions 147 may include N-doped regions in the substrate 111. In another embodiment of the disclosure, the storage regions 147 may be omitted. For example, the storage regions 147 may be replaced with MIMCs (metal-to-metal capacitors), DRAMs (dynamic random access memories), SRAMs (static RAMs), ReRAMs (resistive RAMs), MRAMs (magneto-resistive RAMs), PcRAMs (phase-changeable RAMs) or other temporary storage elements.

The wiring 149 may be formed in the first dielectric layer 112 for routing signals in relation to the logic circuit area 120. Although not shown, the wiring 149 may be electrically coupled to the storage regions 147. The wiring 149 may include electrically conductive elements such as wiring lines, via plugs, resistive elements and/or MIMCs. The wiring 149 may include a metal such as tungsten (W), titanium (Ti), aluminum (Al) or copper (Cu), a metal compound such as a tungsten nitride (WN), a titanium nitride (TiN) or a tantalum nitride (TaN), or a conductor such as a metal alloy.

At least a portion of one or more structures discussed above, for example, the photosensing layer 133, the bottom electrode 131, the top electrode 135, the microlens 137, connectors 141, 143, 145, the storage region 147, and the wiring 149, may configure the organic image sensing pixel 210 disposed in the organic pixel array 200.

Inorganic Pixel Array with Inorganic Image Sensing Pixel

The inorganic image sensing pixel 310 may be provided at the other side of the interconnection region 400 and separated from the organic image sensing pixel 210 by the interconnection region 400. The image sensing area 110 may include an inorganic photosensing region 151 which forms the inorganic image sensing pixel 310. In some implementations, the inorganic image sensing pixel 310 may be configured to further include a grid pattern 153, a color filter 155, a microlens 157, connector 163, 165, a storage region 167, a transfer gate 161 and a wiring 169. The inorganic image sensing pixel 310 are disposed in the inorganic pixel array 300.

The inorganic photosensing regions 151 may be formed in the substrate 111. For example, the inorganic photosensing regions 151 may include photosensing elements, for example, photodiodes, photogates, phototransistors, photoconductors, or some other photosensitive structures capable of generating photocharges. In response to a reception of an incident light, in the aid of the microlens 137 to focus the incident light on the inorganic photosensing regions 151, the inorganic photosensing regions generate photocharges. The microlenses 157 may have a hemispherical shape and may be in optical alignment with the inorganic photosensing regions 151. In some implementations, the diameter of the microlenses 157 may be ½ of the diameter of the microlenses 137. Therefore, when viewed from the top, the size (occupation area) of each of the microlenses 137 may be four times greater than the size (occupation area) of each of the microlenses 157.

To implement a color detection, the color filters 155 may be disposed on the second dielectric layer 113 and between the microlenses 157 and the inorganic photosensing regions 151. Microlenses 157, the color filters 155, and the inorganic photosensing regions 151 may vertical overlap one another and be aligned with optical pass-through. For example, each of the color filters 155 may include one among a green filter, a red filter and a blue filter. The color filters 155 may be formed at the same level as the organic photosensing layer 133 of the organic image sensing pixel 210.

The grid patterns 153 may be disposed in the form of a grid or a mesh on the second dielectric layer 113. The grid patterns 153 may provide windows which allow the incident light to arrive at the inorganic photosensing regions 151. The grid patterns 153 may optically and physically separate the color filters 155 and the color filters 155 may be positioned in the windows defined by the grid patterns 153. The grid patterns 153 may include a metal such as tungsten (W). The grid patterns 153 and the bottom electrodes 131 may be formed at the same level.

The transfer gates 161 may transfer the photocharges generated in the inorganic photosensing regions 151 to the storage regions 167. Depending on on/off operations of the transfer gates 161, the transfer gates 161 may be electrically coupled to the photosensing regions 151 and the storage regions 167. The storage regions 167 may be formed in the substrate 111 to be adjacent to the lower surface of the substrate 111. For example, the second storage regions 167 may include floating diffusion regions which are N type doped. Like the first storage regions 147, the second storage regions 167 may be formed as N-type ions are doped in the substrate 111. In other words, the second storage regions 167 may include N-doped regions in the substrate 111.

The connectors 163 and 165 may be disposed in the first dielectric layer 112 and electrically coupled to the storage regions 167. The connectors 163 and 165 may have a same shape or different shapes. In some implementations, the connectors 161 and 165 may have a pillar shape which extend in different directions from each other. The connectors 163 and 165 may include a metal such as tungsten (W), titanium (Ti), aluminum (Al) or copper (Cu), a metal compound such as a tungsten nitride (WN), a titanium nitride (TiN) or a tantalum nitride (TaN), or a conductor such as a metal alloy. The connectors 143 and the connectors 145 of the inorganic image sensing pixel 210 may be disposed at same levels as the connectors 163 and the connectors 165 of the organic image sensing pixel 310, respectively.

The wiring 169 may be formed in the first dielectric layer 112. Although not shown, the wiring 169 may be electrically coupled with the storage regions 167 and/or the transfer gates 161 of the inorganic image sensing pixels 310. In some implementations, the wiring 169 may be electrically coupled gate electrodes of the transfer gates 161. The wiring 169 may include a metal such as tungsten (W), titanium (Ti), aluminum (Al) or copper (Cu), a metal compound such as a tungsten nitride (WN), a titanium nitride (TiN) or a tantalum nitride (TaN), or a conductor such as a metal alloy.

Interconnection Region Between Organic Pixel Array and Inorganic Pixel Array

In the interconnection region 400, the image sensing device 100 may further include isolation structures, connection structures, and connection pads. In a specific example as shown in FIG. 2, the isolation structures are implemented as first and second isolation dams 115 and 116 and the connection structures are implemented as the first and second TSV structures 170 and 180, and the connection pads are implemented as 171, 175 and 179. The isolation structures and connection structures are not limited thereto and other implementations can be used for the isolation structures and the connection structures. Each of the first TSV structures 170 may include a first upper pad 171, a first upper TSV 173, a first intermediate pad 175 and a first lower TSV 177. Each of the second TSV structures 180 may include a second upper pad 181, a second upper TSV 183, a second intermediate pad 185 and a second lower TSV 187.

The first and second isolation dams 115 and 116 may electrically insulate the substrate 111 from the first and second upper TSVs 173 and 183. When viewed from the top, the first and second isolation dams 115 and 116 may have a polygonal shape and surround the first and second upper TSVs 173 and 183, respectively. The first and second isolation dams 115 and 116 may include dielectric materials which are filled in trenches that pass through the substrate 111. For example, the first and second isolation dams 115 and 116 may include a silicon oxide (SiO$_2$) and/or a silicon nitride (SiN).

The first and second upper TSVs 173 and 183 may pass through the substrate 111 and extending into the first dielectric layer 112. The first and second upper TSVs 173 and 183 may electrically couple the first and second upper pads 171 and 181 to the first and second intermediate pads 175 and 185, respectively. The first and second upper TSVs 173 and 183 may include a metal such as tungsten (W), titanium (Ti), aluminum (Al) or copper (Cu), a metal compound such as a tungsten nitride (WN), a titanium nitride (TiN) or a tantalum nitride (TaN), or a conductor such as a metal alloy.

The first and second upper pads 171 and 181 may be disposed on the second dielectric layer 113 and be vertically aligned with the first and second upper TSVs 173 and 183. The first and second upper pads 171 and 181 may be disposed at the same level as the bottom electrodes 131 and the grid patterns 153. The first and second upper pads 171 and 181 may include the same material as the bottom electrodes 131 and the grid patterns 153.

The first and second intermediate pads 175 and 185 may be disposed between the first upper TSV 173 and the first lower TSV and between the second upper TSV 183 and the second lower TSV 187. The first and second intermediate pads 175 and 185 may be disposed at the same or similar level as the wiring 149 and 169 and electrically couple the first and second upper TSVs 173 and 183 to the first and second lower TSVs 177 and 187, respectively. The first and second intermediate pads 175 and 185 may include the same conductor as the wiring 149 and 169. The first intermediate pad 175 may be electrically coupled to at least a portion of the wiring 149, and the second intermediate pad 185 may be electrically coupled to at least a portion of the wiring 169.

The first and second lower TSVs 177 and 187 may be disposed in the upper dielectric layer 112 of the image sensing area, the intermediate layer 190, and the dielectric layer 122 of the logic circuit area 120. The first and second lower TSVs 177 and 187 vertically extend from the first and second intermediate pads 175 and 185 and pass through the upper dielectric layer 112 and the intermediate layer 190. The first and second lower TSVs 177 and 187 may extend into the lower dielectric layer 122 of the logic circuit area 120. The first and second lower TSVs 177 and 187 may include the same conducting material as the first and second upper TSVs 173 and 183. Although FIG. 2 shows that the upper TSVs 173 and 183 are separately formed from the lower TSVs 177 and 187, other implementations are also possible. For example, in another embodiment of the disclosure, the first upper and lower TSVs 173 and 177 may be formed as an integral unit and the second upper and lower TSVs 183 and 187 may be formed as an integral unit. In this case, the integral unit of the first upper and lower TSVs 173 and 177 and the integral unit of the second upper and lower TSVs 183 and 187 may pass through the first and second intermediate pads 175 and 185, respectively.

Logic Circuit Area

The logic circuit area 120 is located on an opposite side of the image sensing area 110 such that the intermediate layer 190 is located between the image sensing area 110 and the logic circuit area 120. The logic circuit area 120 may include a substrate 121 and a dielectric layer 122 on the substrate 121. The substrate 121 may include monocrystalline silicon doped with an N-type ion and a P-type ion.

The logic circuit area 120 may include various logic circuits, e.g., first and second logic circuits 125 and 126, to process signals generated from the organic image sensing pixels 210 and the inorganic image sensing pixels 310. The first and second logic circuits 125 and 126 may include a plurality of transistors which are disposed on the upper surface of the lower substrate 121 and a plurality of logic wiring lines and logic via plugs which are disposed in the lower dielectric layer 122. The first and second logic circuits 125 and 126 may include an image signal processor (ISP), a storage element such as a DRAM (dynamic random access memory) and/or an SRAM (static random access memory), a register, a voltage, timing and/or signal generator, an output buffer, an amplification circuit or other various common logic circuits. For example, the first logic circuits 125 may include storage elements such as DRAMs and/or SRAMs. The second logic circuits 126 may include an image signal processor. The first and second logic circuits 125 and 126 may be commonly shared by the organic pixel array 200 and the inorganic pixel array 300. For example, the first and second logic circuits 125 and 126 may process the image signals generated from the organic image sensing pixels 210 of the organic pixel array 200 and the image signals generated from the inorganic image sensing pixels 310 of the inorganic pixel array 300. In some implementations, the first logic circuits 125 may store first image signals provided from the organic image sensing pixels 210 in the organic pixel array 200 and second image signals provided from the inorganic image sensing pixels 310 in the inorganic pixel array 300. The first image signals may include electrical signals which are provided through the first TSV structures 170 from the organic image sensing pixels 210, and the second image signals may include electrical signals which are provided through the second TSV structures 180 from the inorganic image sensing pixels 310. The second logic circuits 126 may process the first and second image signals which are stored in the first logic circuits 125.

With the logic circuit area 120 which is separately located from the image sensing area 110, the first and second image signals can be processed in the logic circuit area 120 after being transferred from the image sensing area 110 to the logic circuit area 120. Therefore, the logic circuit area 120 does not need to be equipped with a space for transistors of the first and second logic circuits 125 and 126, and the logic circuit area 120 can utilize its space for the organic image sensing pixels 210 and the inorganic image sensing pixels 310. Thus, in the image sensing area 110, the pixel integration degree of the organic pixel array 200 and the pixel integration degree of the inorganic pixel array 300 can be improved. In certain applications, with the improved integration degree of the organic pixel array 200 and the inorganic pixel array 300, the image sensing device 100 can be miniaturized.

In some implementations, the organic image sensing pixels 210 and the inorganic image sensing pixels 310 can operate simultaneously, sequentially, or selectively, by applying necessary control signals to the organic image sensing pixels 210 and the inorganic image sensing pixels 310. To enable or disable a particular pixel in a pixel array of an image sensing device can be implemented by controlling a signal applied to a corresponding row and a corresponding column in the pixel array. In some implementations, the organic image sensing pixels 210 and the inorganic image sensing pixels 310 may be controlled to operate at the same time. In a specific example for obtaining one or more still images, both the organic image sensing pixels 210 and the organic image sensing pixels 310 can operate to provide image information. In the case where the organic image sensing pixels 210 and the inorganic image sensing pixels 310 simultaneously operate, the storage regions 147 and 167 may temporarily store image informations. The image informations which are temporarily stored in the storage regions 147 and 167 may be provided to the first logic circuits 125 or the second logic circuits 126 through the first and second TSV structures 170 and 180. Thus, the first and second logic circuits 125 and 126 may store and process the first and second image signals.

The storing and processing of the first and second image signals by the first and second logic circuits 125 and 126 can be carried out simultaneously, sequentially, or selectively. Therefore, it is possible to increase the efficiency of the first and second logic circuits 125 and 126. The increased efficiency of the first and second logic circuits 125 and 126 can help to reduce the size of the logic circuit area needed for processing the first and second image signals 120. In another embodiment, if the logic circuit area is maintained as the same size, a greater number of electrical circuits can be disposed in the substrate 121 of the logic circuit area 120 to increase the speed of processing of the first and second logic circuits 125 and 126.

In some other implementations, the organic image sensing pixels 210 and the inorganic image sensing pixels 310 may be controlled to operate independently from each other. For example, the organic image sensing pixels can be turned off while the inorganic image sensing pixels 310 operate to generate image signals in response to the light incident on the image sensing device 100. In this case, the first and second logic circuits 125 and 126 may store and process the second image signals generated from the inorganic image sensing pixels 310. In some implementations, the inorganic image sensing pixels 310 can be turned off while the organic image sensing pixels 210 operate to generate image signals in response to the light incident on the image sensing device 100. In this case, the first and second logic circuits 125 and 126 may store and process the first image signals generated from the organic image sensing pixels 210. In a specific example for obtaining one or more motion images, the organic image sensing pixels 210 can be turned off and the organic image sensing pixels 310 only can operate to provide image information.

In some implementations, the second logic circuit 126 may process at least one of the first image signal or the second image signal. In this case, while the organic image sensing pixels 210 and the inorganic image sensing pixels 310 are turned on, the second logic circuit 126 processes the image signal selected to be processed. In some implementations, both the first image signal and the second image signals may be selected to be processed in the second logic circuit 126. In some implementations, either the first image signal or the second image signals may be selected to be processed in the second logic circuit 126. Selecting one or two signals between the first image signal and the second image signal can be implemented in various manners.

In the example of FIG. 2, the organic image sensing pixels 210 and the inorganic image sensing pixels 310 may be disposed on the same substrate 111, and the first logic circuits 125 and the second logic circuits 126 may be disposed on the same substrate 121. In some implementations, the image sensing device 100 based on the disclosed technology can be utilized in various applications including at least one of a complex functioned image sensor, an SIP (system-in-chip), an SOP (system-on-chip), or a camera system.

Figure 3A:
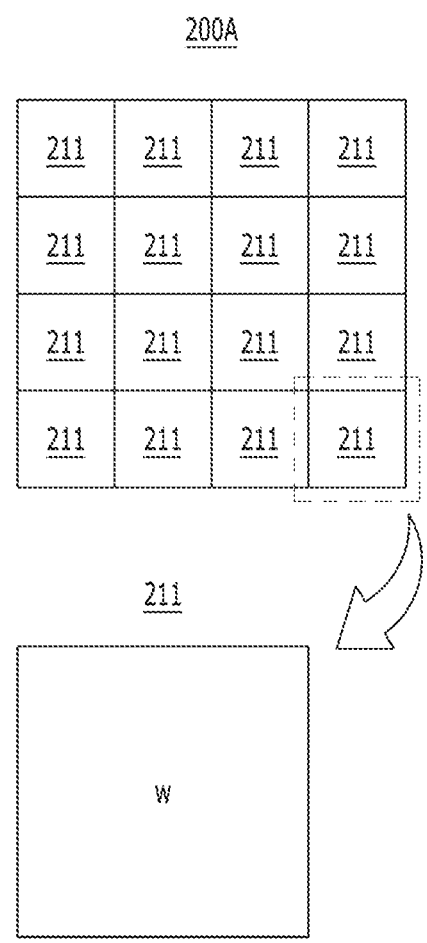
FIGS. 3A and 3B are layout diagrams illustrating representations of examples of an organic pixel array and an inorganic pixel array of an image sensing device in accordance with an embodiment of the disclosed technology.
Figure 3B:
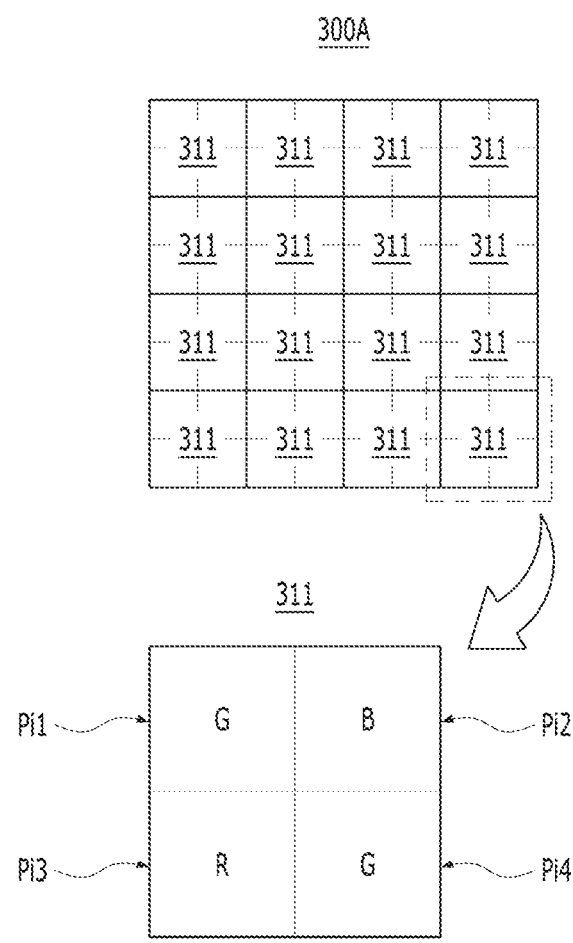

FIGS. 3A and 3B are layout diagrams illustrating representations of examples of an organic pixel array 200A and an inorganic pixel array 300A of an image sensing device 100 in accordance with an embodiment of the disclosed technology. Referring to FIGS. 3A and 3B, the organic pixel array 200A and the inorganic pixel array 300A of the image sensing device 100 in accordance with the embodiment of the disclosed technology may include organic image sensing pixels 211 and inorganic image sensing pixels 311, respectively, which are arranged in the form of matrixes including rows and columns. Each of the inorganic image sensing pixels 311 may have first to fourth sub pixels Pi1 to Pi4. The first to fourth sub pixels Pi1 to Pi4 may have a Bayer pattern arrangement of two rows and two columns. The first to fourth sub pixels Pi1 to Pi4 may include one red pixel R, one blue pixel B and two green pixels G. The green pixels G may be diagonally arranged. Also, the red pixel R and the blue pixel B may be diagonally arranged. For example, the first sub pixel Pi1 of a first row and a first column and the fourth sub pixel Pi4 of a second row and a second column may be green pixels G, the second sub pixel Pi2 of the first row and the second column may be the blue pixel B, and the third sub pixel Pi3 of the second row and the first column may be the red pixel R. In the drawing, the arrangement of the color pixels R/G/B is an illustrative example. The first to fourth sub pixels Pi1 to Pi4 may share the same storage region (for example, the same floating diffusion region). In some implementations, referring to FIG. 2, the storage region 167 may be shared by the first to fourth sub pixels Pi1 to Pi4.

When viewed from the top, the organic image sensing pixels 211 and the inorganic image sensing pixels 311 may have the same size (occupation area). Thus, the occupation area of each organic image sensing pixel 211 may be four times the occupation area of each of the sub pixels Pi1 to Pi4. Since each of the organic image sensing pixels 211 and the inorganic image sensing pixels 311 is one unit image pixel for sensing an image, the image resolutions of the organic pixel array 200A and the inorganic pixel array 300A may be the same.

The organic image sensing pixel 211 may be transparent to visible light. For example, the organic image sensing pixel 211 may be implemented to enable a white light detection. In some implementations, the organic photosensing layer 133 of the organic image sensing pixel 211 includes a specific material which has properties that allow white light to pass through the organic photosensing layer 133. In some other implementations, the organic image sensing pixel 211 can include a white filter W which is transparent to visible light. Since the organic image sensing pixel 211 may be used to convert most of collected visible light into an image signal, the light loss of the organic image sensing pixel 211 is relatively smaller than that of the inorganic image sensing pixel 311. Thus, the organic image sensing pixel 211 may have relatively higher light sensitivity than the inorganic image sensing pixel 311. On the other hand, since the organic image sensing pixel 211 does not separate the wavelength (color) of light, implementing a color image can be not as easy as the inorganic image sensing pixel 311.

As compared to the organic image sensing pixels 211, there are some losses of the light in converting the visible light into an image signal by the inorganic image sensing pixels 311. Instead, the inorganic image sensing pixels 311 has a good or better color sensitivity than that of the organic image sensing pixel 211. Therefore, having both the organic pixel array 200 with the organic image sensing pixels 211 and the inorganic pixel array 300 with the inorganic image sensing pixels 311 in the image sensing device it is possible to obtain an image information that is optimized for needs. As discussed above, in some implementations, the organic pixel array 200 and the inorganic pixel array 300 can be controlled to operate at the same time. In this case, the image information having excellent light sensitivity which is obtained from the organic pixel array 200A and an image information having excellent color sensitivity which is obtained from the inorganic pixel array 300A can be obtained. In some implementations, only one of the organic pixel array 200 and the inorganic pixel array 300 can be controlled to operate, while the other one of the organic pixel array 200 and the inorganic pixel array 300 is controlled to be turned off. In this case, the image information with the high light sensitivity or the image information with the high color sensitivity can be obtained.

Figure 4A:
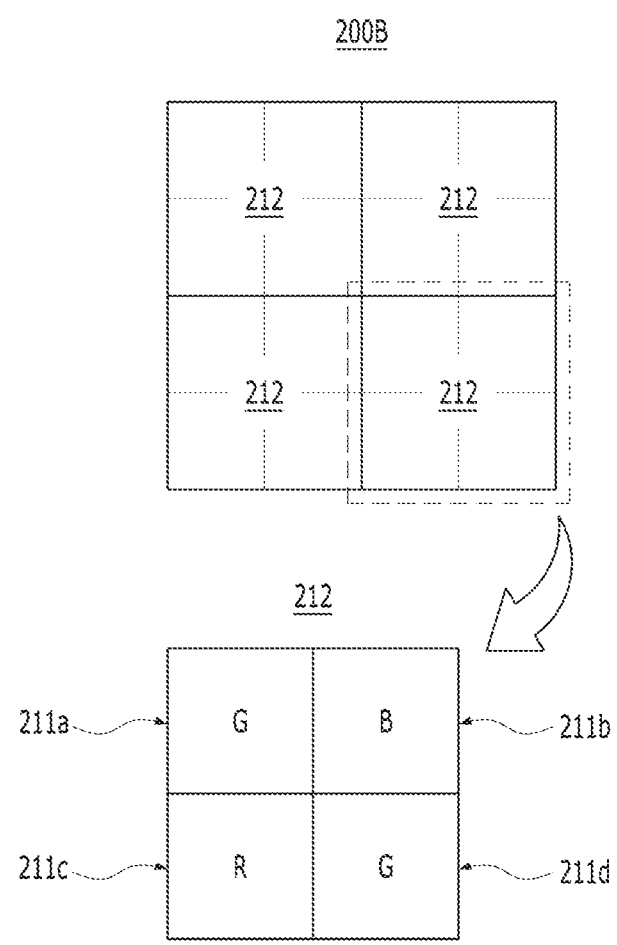
FIGS. 4A and 4B are layout diagrams illustrating representations of examples of an organic pixel array and an inorganic pixel array of an image sensing device in accordance with an embodiment of the disclosed technology.
Figure 4B:
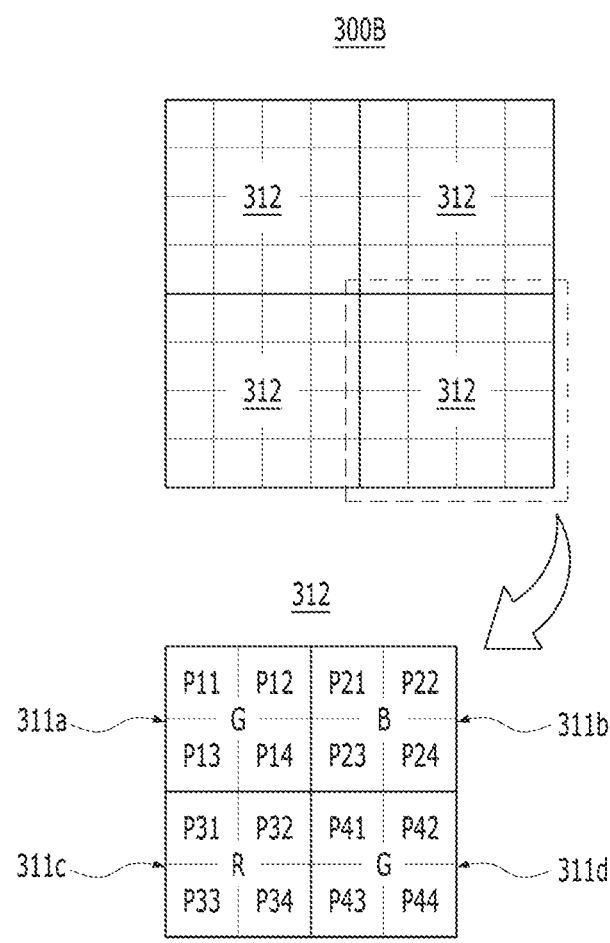

FIGS. 4A and 4B are layout diagrams illustrating representations of examples of an organic pixel array 200B and an inorganic pixel array 300B of an image sensing device 100 in accordance with an embodiment of the disclosed technology. Referring to FIGS. 4A and 4B, the organic pixel array 200B and the inorganic pixel array 300B of the image sensing device 100 in accordance with the embodiment of the disclosed technology may include organic image sensing pixel groups 212 and inorganic image sensing pixel groups 312, respectively, which are arranged in the form of matrixes including rows and columns. When viewed from the top, one organic image sensing pixel group 212 and one inorganic image sensing pixel group 312 may have the same size (occupation area).

Each of the organic image sensing pixel groups 212 may have four organic image sensing pixels 211a to 211d. In other words, the four organic image sensing pixels 211a to 211d illustrated in FIG. 4A may configure one organic image sensing pixel group 212. The organic image sensing pixels 211a to 211d may have a Bayer pattern arrangement of two rows and two columns. For example, the organic image sensing pixel group 212 may include a first organic image sensing pixel 211a of a first row and a first column, a second organic image sensing pixel 211b of the first row and a second column, a third organic image sensing pixel 211c of a second row and the first column, and a fourth organic image sensing pixel 211d of the second row and the second column. The organic image sensing pixels 211a to 211d may include color filters R, G and B, respectively. For example, the first organic image sensing pixel 211a may include a green filter G, the second organic image sensing pixel 211b may include a blue filter B, the third organic image sensing pixel 211c may include a red filter R, and the fourth organic image sensing pixel 211d may include a green filter G. In some implementations, the implementations of the color filters R, G, B in the organic image sensing pixels 211a to 211d can be provided by having additional color filters R, G, B. In some implementations, the organic image sensing pixels 211a to 211d can include selected materials which have properties to allow red light, green light, blue light to pass through the organic photosensing layer 133.

The inorganic image sensing pixel groups 312 may have a quad pixel arrangement. For example, each of the inorganic image sensing pixel groups 312 may have first to fourth inorganic image sensing pixels 311a to 311d which are arranged in the form of a matrix of two rows and two columns. The first to fourth inorganic image sensing pixels 311a to 311d may include four sub pixels P11 to P14, P21 to P24, P31 to P34 and P41 to P44, respectively.

The sub pixels P11 to P14 of the first inorganic image sensing pixel 311a may have the same color. For example, the sub pixels P11 to P14 of the first inorganic image sensing pixel 311a may all have a green color filter G.

The sub pixels P21 to P24 of the second inorganic image sensing pixel 311b may have the same color. For example, the sub pixels P21 to P24 of the second inorganic image sensing pixel 311b may all have a blue color filter B.

The sub pixels P31 to P34 of the third inorganic image sensing pixel 311c may have the same color. For example, the sub pixels P31 to P34 of the third inorganic image sensing pixel 311c may all have a red color filter R.

The sub pixels P41 to P44 of the fourth inorganic image sensing pixel 311d may have the same color. For example, the sub pixels P41 to P44 of the fourth inorganic image sensing pixel 311d may all have a green color filter G.

In another embodiment of the disclosed technology, the image sensing device 100 may have the organic pixel array 200A illustrated in FIG. 3A and the inorganic pixel array 300B illustrated in FIG. 4B. For example, the organic image sensing pixels 211 of the organic pixel array 200A may all have a white filter W which is transparent to visible light, and the inorganic pixel array 300B may have a quad pixel arrangement. In some implementations, the organic pixel array 200A can have capabilities filtering white light and red, green, blue light. In this case, the organic photosensing layer 133 can be prepared to have a specific material to capture white light and the red, green and blue color filters are additionally disposed between the organic photosensing layer 133 and the microlens 137. Alternately, the organic photosensing layer 133 can be prepared to have specific materials allowing to capture red, green, and blue light and the white color filter is additionally disposed between the organic photosensing layer 133 and the microlens 137.

Figure 5A:
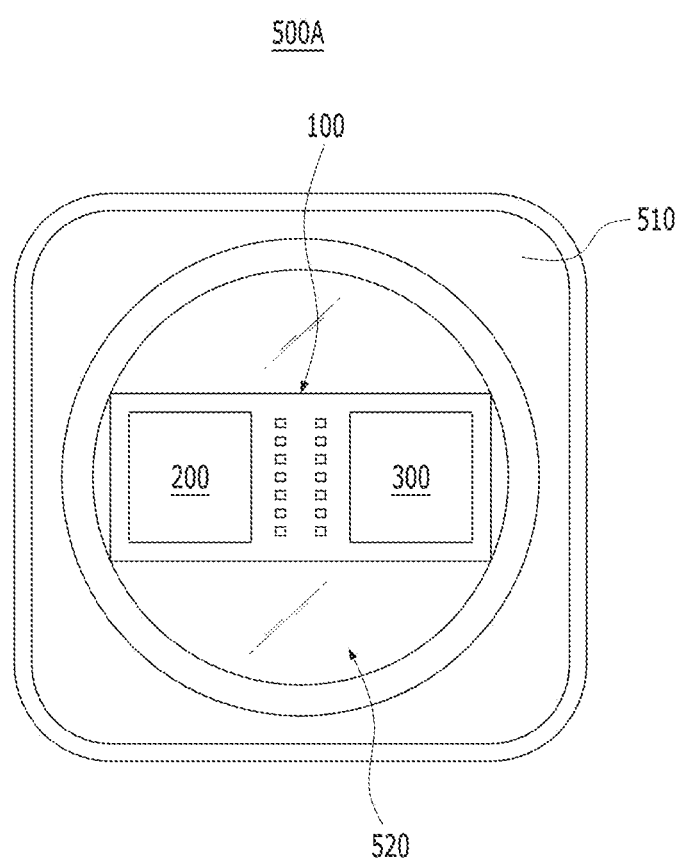
FIGS. 5A, 5B, 6A and 6B are diagrams conceptually illustrating representations of examples of camera systems in accordance with embodiments of the disclosed technology.
Figure 5B:
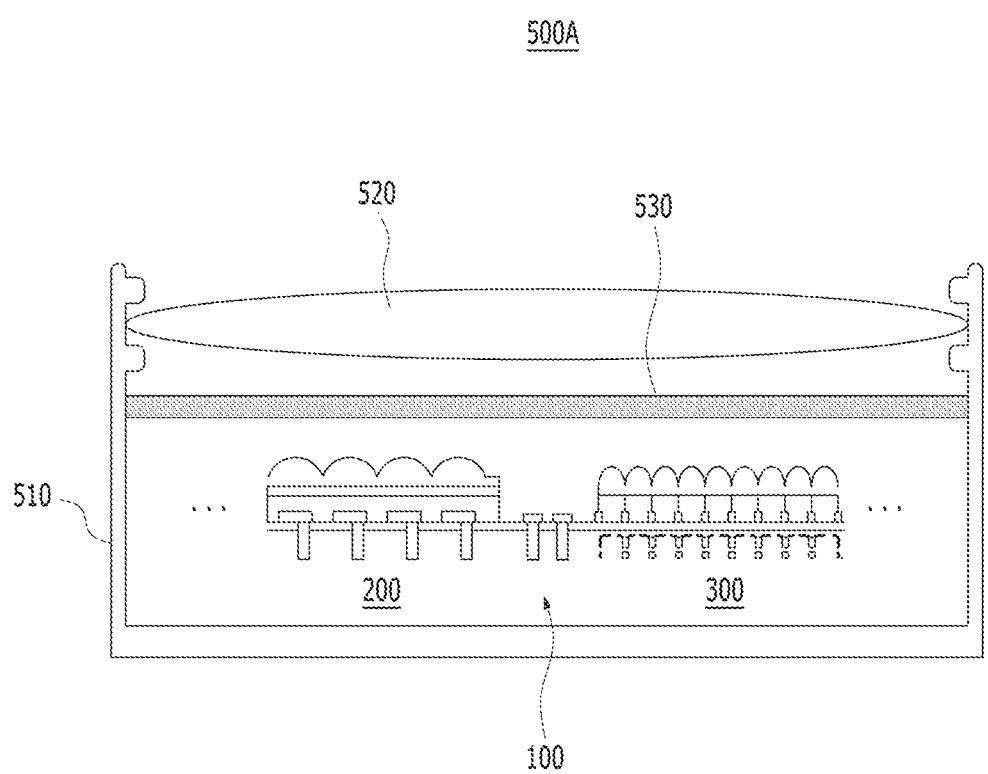

FIGS. 5A and 5B are diagrams conceptually illustrating a representation of an example of a camera system 500A in accordance with an embodiment of the disclosed technology. Referring to FIGS. 5A and 5B, the camera system 500A in accordance with the embodiment of the disclosed technology may include a housing 510, an image sensing device 100, and a lens assembly 520. In order to facilitate understanding of the implementations of the disclosed technology, the organic pixel array 200 and the inorganic pixel array 300 of the image sensing device 100 are illustrated. The organic pixel array 200 of the image sensing device 100 may be one of the organic pixel arrays 200A and 200B described above with reference to FIGS. 3A and 4A. The inorganic pixel array 300 of the image sensing device 100 may be one of the inorganic pixel arrays 300A and 300B described above with reference to FIGS. 3B and 4B. The lens assembly 520 may include a plurality of optical lenses. The lens assembly 520 may simultaneously cover the organic pixel array 200 and the inorganic pixel array 300 of the image sensing device 100. The camera system 500A may further include an infrared filter 530 which is disposed between the image sensing device 100 and the lens assembly 520 in the housing 520. The infrared filter 530 may reflect and filter the infrared rays of light transferred to the camera system 500A, thereby correcting the color of an image and improving the sharpness of the image.

Figure 6A:
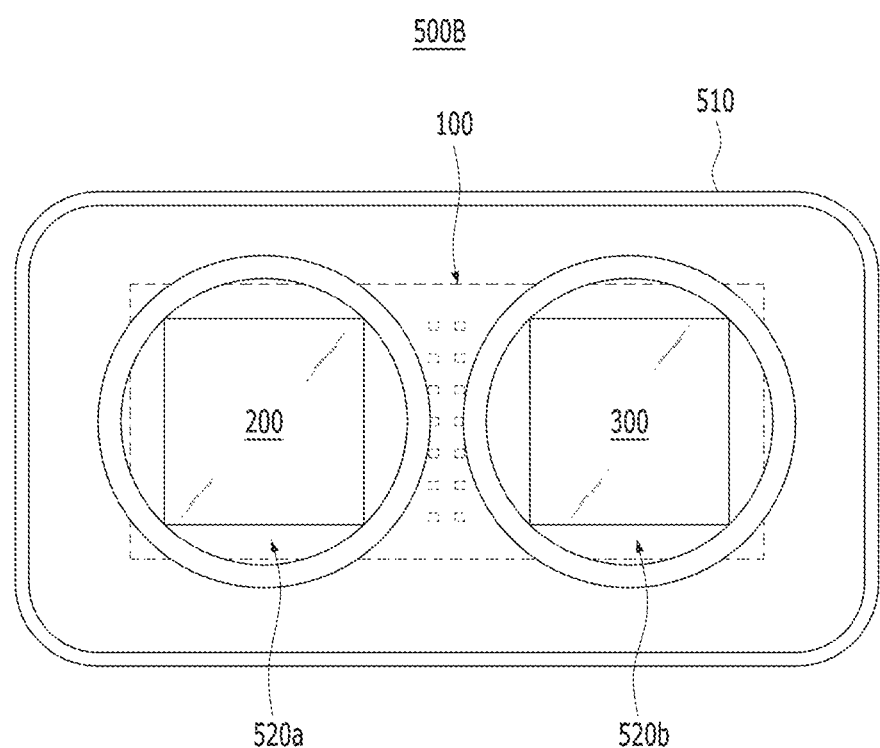
Figure 6B:
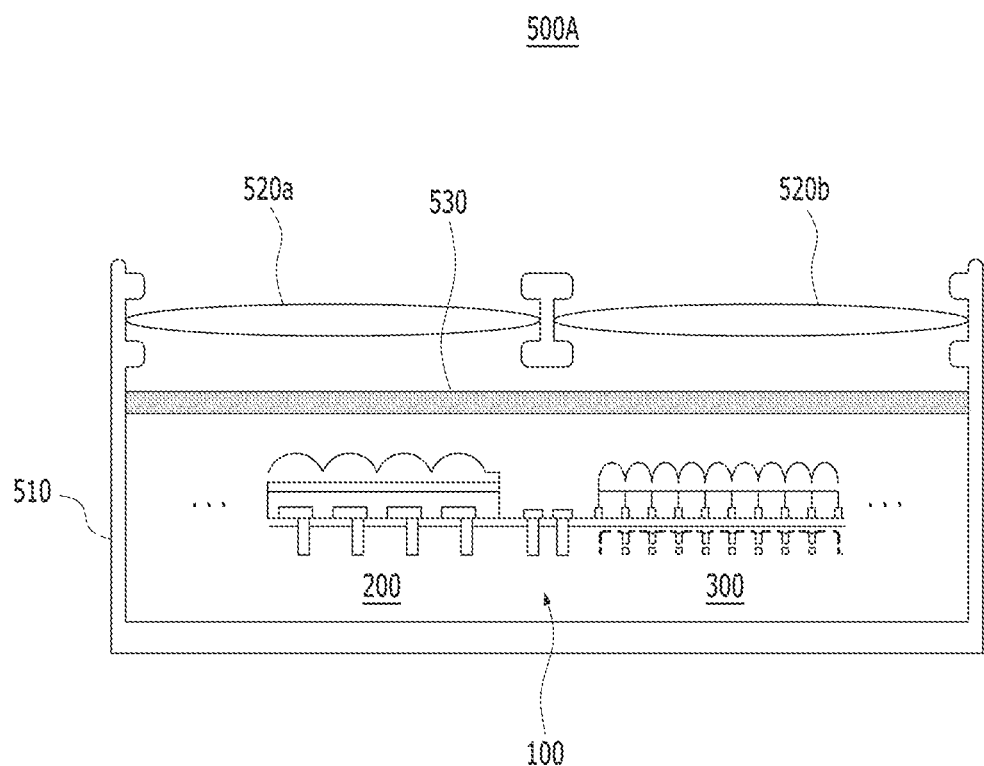

FIGS. 6A and 6B are diagrams conceptually illustrating a representation of an example of a camera system 500B in accordance with an embodiment of the disclosed technology. Referring to FIGS. 6A and 6B, the camera system 500B in accordance with the embodiment of the disclosure may include a housing 510, an image sensing device 100, and lens assemblies 520a and 520b. The lens assemblies 520a and 520b may include a first lens assembly 520a which covers the organic pixel array 200 and a second lens assembly 520b which covers the inorganic pixel array 300. Accordingly, since the camera system 500B includes the lens assemblies 520a and 520b which have a relatively small diameter, the camera system 500B may operate efficiently. The camera system 500B may further include an infrared filter 530 which is disposed between the image sensing device 100 and the lens assemblies 520a and 520b in the housing 510.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An image sensing device comprising:
    an organic photosensing region including an organic material and configured to provide a first image signal generated in response to light incident on the organic photosensing region;
    top and bottom electrodes formed on opposite sides of the organic photosensing region and configured to facilitate generation of the first image signal;
    a first storage region disposed relative to the organic photosensing region and configured to store the first image signal;
    an inorganic photosensing region including an inorganic material and configured to provide a second image signal generated in response to light incident on the inorganic photosensing region;
    a second storage region disposed relative to the inorganic photosensing region and configured to store the second image signal; and
    a logic circuit disposed to receive the first image signal and the second image signal and configured to process at least one of the first image signal or the second image signal,
    wherein the inorganic photosensing region further includes a grid pattern formed at the same level as the bottom electrode and includes the same material as the bottom electrode.

2. The image sensing device of claim 1, wherein the organic photosensing region and the inorganic photosensing region are disposed over a first substrate.

3. The image sensing device of claim 2, wherein the logic circuit is disposed over a second substrate different from the first substrate.

4. The image sensing device of claim 1, wherein the organic photosensing region includes organic image sensing pixels and the inorganic photosensing region includes inorganic image sensing pixels, each organic image sensing pixel having the same size as that of each inorganic image sensing pixel.

5. The image sensing device of claim 1, wherein the organic photosensing region includes organic image sensing pixels and the inorganic photosensing region includes inorganic image sensing pixels, each inorganic image sensing pixel having sub-pixels, each organic image sensing pixel having a size four times greater than that of a sub-pixel of each inorganic image sensing pixel.

6. The image sensing device of claim 1, wherein the top electrode includes a transparent conducting material.

7. The image sensing device of claim 1, wherein the bottom electrode includes a metal.

8. The image sensing device of claim 1, wherein the organic photosensing region further includes a color filter disposed over the organic material and configured to allow the first image signal to include color information corresponding to certain colored light.

9. The image sensing device of claim 1, wherein the organic material allows the first image signal to include color information corresponding to certain colored light.

10. The image sensing device of claim 1, wherein the inorganic photosensing region further includes a color filter disposed over the inorganic material and configured to allow the first image signal to include color information from certain colored light.

11. The image sensing device of claim 1, wherein the organic photosensing region further includes a first microlens and the inorganic photosensing region further includes a second microlens, the first microlens having a diameter two times greater than that of the second microlens.

12. The image sensing device of claim 1, wherein the image sensing device is part of a camera image system that includes:
the image sensing device;
a lens formed over the image sensing device; and
a housing that forms a space for accommodating the image sensing device.

13. The image sensing device of claim 12, wherein the camera image system further includes an infrared filter disposed between the image sensing device and the lens and configured to reflect the infrared rays of light.

14. An image sensing device comprising:
a substrate;
organic image sensing pixels disposed over a first region of the substrate and including organic photosensing materials; and
inorganic image sensing pixels disposed over a second region of the substrate and including inorganic photosensing materials, the second region separated from the first region,
wherein each of the organic image sensing pixels includes:
an organic photosensing layer including an organic material to generate first photocharges in response to light incident on the organic photosensing pixel;
top and bottom electrodes formed on opposite sides of the organic photosensing layer and configured to facilitate generation of the first photocharges; and
wherein each of the inorganic image sensing pixels further includes a grid pattern formed at the same level as the bottom electrode and includes the same material as the bottom electrode.

15. The image sensing device of claim 14, wherein each of the organic image sensing pixels further includes:
a first storage region disposed relative to the organic photosensing region and configured to store the first photocharges.

16. The image sensing device of claim 14, wherein each of the inorganic image sensing pixels includes:
an inorganic photoconversion element configured to generate second photocharges in response to light incident on the inorganic photosensing pixel; and
a second storage region disposed relative to the inorganic photoconversion element and configured to store the second photocharges.

17. The image sensing device of claim 16, wherein each of the inorganic image sensing pixels further includes:
a microlens; and
a color filter disposed under the microlens and over the substrate,
wherein the microlens and the color filter are in optical alignment with the inorganic photoconversion element.

18. The image sensing device according to claim 14, wherein each of the inorganic image sensing pixels has the size same as that of each organic image sensing pixels.

19. The image sensing device according to claim 14, wherein each of the inorganic image sensing pixels has sub-pixels, each sub-pixel having a corresponding color filter that is configured to allow light of a particular wavelength or range of wavelengths to reach the sub-pixel.

20. The image sensing device according to claim 14, further comprising an interconnection region disposed between the first region and the second region of the substrate and including first connections to the organic image sensing pixels and second connections to the inorganic image sensing pixels.

21. The image sensing device according to claim 14, further comprising an additional substrate on which a logic circuit is formed, the logic circuit providing control signals to the organic image sensing pixels and the inorganic image sensing pixels.

22. The image sensing device according to claim 21, wherein the additional substrate is spaced apart from the substrate by a dielectric layer.

23. The image sensing device of claim 14, wherein the image sensing device is part of a camera image system that includes:
the image sensing device;
a lens formed over the image sensing device; and
a housing that forms a space for accommodating the image sensing device.

24. The image sensing device of claim 23, wherein the camera image system further includes an infrared filter disposed between the image sensing device and the lens and configured to reflect the infrared rays of light.

* * * * *